(12) United States Patent
Tran

(10) Patent No.: US 11,031,050 B2
(45) Date of Patent: Jun. 8, 2021

(54) POWER LINE COMPENSATION FOR FLASH MEMORY SENSE AMPLIFIERS

(71) Applicant: Silicon Storage Technology, Inc., San Jose, CA (US)

(72) Inventor: Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/526,987

(22) Filed: Jul. 30, 2019

(65) Prior Publication Data

US 2019/0355420 A1    Nov. 21, 2019

Related U.S. Application Data

(62) Division of application No. 14/286,936, filed on May 23, 2014, now abandoned, which is a division of application No. 11/528,748, filed on Sep. 27, 2006, now Pat. No. 8,773,934.

(51) Int. Cl.

| | | |
|---|---|---|
| *G11C 7/06* | (2006.01) | |
| *G11C 7/02* | (2006.01) | |
| *G11C 16/28* | (2006.01) | |
| *G11C 11/56* | (2006.01) | |
| *G11C 16/04* | (2006.01) | |
| *G11C 5/14* | (2006.01) | |
| *G11C 11/4091* | (2006.01) | |
| *G11C 16/30* | (2006.01) | |

(52) U.S. Cl.
CPC .............. *G11C 7/062* (2013.01); *G11C 5/147* (2013.01); *G11C 7/02* (2013.01); *G11C 7/06* (2013.01); *G11C 7/065* (2013.01); *G11C 7/067* (2013.01); *G11C 11/4091* (2013.01); *G11C 11/5642* (2013.01); *G11C 16/0408* (2013.01); *G11C 16/28* (2013.01); *G11C 16/30* (2013.01); *G11C 2207/063* (2013.01); *G11C 2211/5645* (2013.01)

(58) Field of Classification Search
CPC ............ G11C 7/062; G11C 5/147; G11C 7/02
USPC ..................................... 365/185.03
See application file for complete search history.

(56) References Cited

U.S. PATENT DOCUMENTS

| | | |
|---|---|---|
| 4,780,686 A | 10/1988 | Murakami et al. |
| 5,241,505 A | 8/1993 | Hashimoto |
| 5,267,202 A | 11/1993 | Dallabora et al. |
| 5,363,340 A | 11/1994 | Ishikawa |
| 5,386,158 A | 1/1995 | Wang |
| 5,508,643 A | 4/1996 | Khieu |
| 5,539,694 A | 7/1996 | Rouy |
| 5,568,073 A | 10/1996 | McClure |

(Continued)

*Primary Examiner* — Anthan Tran
(74) *Attorney, Agent, or Firm* — DLA Piper LLP US

(57) ABSTRACT

In one aspect, the invention concerns a memory system that compensates for power level variations in sense amplifiers for multilevel memory. For example, a compensation circuit can be employed to compensate for current or voltage variations in the power supplied to multilevel memory sense amplifiers. As another example, compensation can be accomplished by application of a bias voltage to the power supply. Another example is a sense amplifier configured with improved input common mode voltage range. Such sense amplifiers can be two-pair and three-pair sense amplifiers. Further examples of the invention include more simplified sense amplifier configurations, and sense amplifiers having reduced leakage current.

6 Claims, 17 Drawing Sheets

(56) References Cited

U.S. PATENT DOCUMENTS

| | | |
|---|---|---|
| 5,568,425 A | 10/1996 | Song |
| 5,629,892 A | 5/1997 | Tang |
| 5,774,398 A | 6/1998 | Ishida |
| 5,815,435 A | 9/1998 | Van Tran |
| 5,841,165 A | 11/1998 | Chang et al. |
| RE36,579 E | 2/2000 | Pascucci et al. |
| 6,046,932 A | 4/2000 | Bill et al. |
| 6,051,999 A | 4/2000 | To et al. |
| 6,075,738 A | 6/2000 | Takano |
| 6,118,318 A | 9/2000 | Fifield et al. |
| 6,134,141 A | 10/2000 | Wong |
| 6,141,927 A | 11/2000 | Ooishi |
| 6,154,064 A | 11/2000 | Proebsting |
| 6,169,424 B1 | 1/2001 | Kurd |
| 6,208,559 B1 | 3/2001 | Tu et al. |
| 6,275,415 B1 | 8/2001 | Haddad et al. |
| 6,282,145 B1 | 8/2001 | Tran et al. |
| 6,323,724 B1 * | 11/2001 | Uekubo ............. G05F 3/205 327/538 |
| 6,392,485 B1 | 5/2002 | Doi et al. |
| 6,396,757 B1 | 5/2002 | Quader et al. |
| 6,441,649 B1 | 8/2002 | Martin et al. |
| 6,466,488 B2 | 10/2002 | Sowards et al. |
| 6,501,682 B2 | 12/2002 | Yoshida |
| 6,522,580 B2 | 2/2003 | Chen et al. |
| 6,566,926 B1 | 5/2003 | Patterson |
| 6,605,997 B1 | 8/2003 | Hanson et al. |
| 6,606,265 B2 | 8/2003 | Bergemont et al. |
| 6,777,984 B2 | 8/2004 | Hangaishi |
| 6,856,190 B2 | 2/2005 | Kihara |
| 6,930,550 B1 | 8/2005 | Wu |
| 6,985,036 B2 | 1/2006 | Bhattacharjee et al. |
| 7,109,770 B1 | 9/2006 | Bui |
| 7,187,236 B2 | 3/2007 | Britton et al. |
| 7,193,464 B2 | 3/2007 | Wang et al. |
| 7,227,411 B2 | 6/2007 | Slamowitz |
| 7,355,450 B1 | 4/2008 | Smith |
| 7,429,881 B2 | 9/2008 | Deng et al. |
| 7,453,299 B1 | 11/2008 | Bui |
| 2002/0186586 A1 | 12/2002 | Conte |
| 2002/0196664 A1 | 12/2002 | Pasotti et al. |
| 2003/0002345 A1 | 1/2003 | Avni et al. |
| 2005/0024956 A1 | 2/2005 | Tran et al. |
| 2006/0023531 A1 | 2/2006 | Crippa |
| 2006/0097791 A1 | 5/2006 | Shuler et al. |

* cited by examiner

POWER LINE COMPENSATION FOR FLASH MEMORY SENSE AMPLIFIERS

PRIORITY CLAIMS

This application is a divisional application of U.S. patent application Ser. No. 14/286,936, filed on May 23, 2014, and titled, "POWER LINE COMPENSATION FOR FLASH MEMORY SENSE AMPLIFIERS," which is a divisional application of U.S. patent application Ser. No. 11/528,748, filed on Sep. 27, 2006, titled, "POWER LINE COMPENSATION FOR FLASH MEMORY SENSE AMPLIFIERS," and issued as U.S. Pat. No. 8,773,934, both of which are incorporated by reference herein.

BRIEF DESCRIPTION OF THE INVENTION

The present invention relates to sense amplifiers and, more particularly, relates to sense amplifiers that compensate for variations in their power lines.

BACKGROUND OF THE INVENTION

As information technology progresses at an unprecedented pace, the need for information storage increases proportionately. Accordingly, the non volatile information in stationary or portable communication demands higher capability and capacity storage. One approach to increasing the amount of storage is by decreasing physical dimensions of the stored bit (e.g., memory cell) to smaller dimensions such as nanocell technology. Another approach is to increase the storage density per bit. The second approach is known as digital multilevel nonvolatile storage technology. A sense amplifier reads the content of a memory cell by comparison to reference levels. As more bits are stored in a multilevel memory cell, the voltage separation of reference levels decreases. Variations in the power supplied to a sense amplifier may change data or reference levels to cause erroneous detection of the content of a memory cell. Other variations, such as variations in ground voltage levels, also contribute to inaccurate data readings. Accordingly, it is desirable to smooth out such variations in sense amplifier power supply, and compensate for such other variations, so as to improve the accuracy with which data is written to, or read from, multilevel memory cells.

SUMMARY OF THE INVENTION

The present invention provides a sense amplifier that may include well voltage compensation of transistors therein. It also includes other compensation methods and means. The invention can be implemented in numerous ways. Accordingly, various embodiments of the invention are discussed below.

In one embodiment, a multilevel memory sensing system for detecting a voltage level stored in a multilevel memory cell comprises a memory sensing circuit connected to the multilevel memory cell and having a power terminal for receiving a power supply current, wherein the power supply current is subject to a variation. A current compensation circuit is connected to the power terminal of the memory sensing circuit, and configured to supply a compensation current to the power terminal so as to compensate for the variation of the power supply current.

In another embodiment, a multilevel memory sensing system for detecting a voltage level stored in a multilevel memory cell comprises a memory sensing circuit connected to the multilevel memory cell and having a virtual ground terminal connected to the multilevel memory cell. Also included is an operational amplifier having an output connected to the virtual ground terminal, the operational amplifier configured as a voltage follower circuit for maintaining the virtual ground terminal at a ground voltage.

In another embodiment, a multilevel memory sensing system for detecting a voltage level stored in a multilevel memory cell comprises a plurality of memory sensing circuits each having a first terminal connected to a multilevel memory cell, an output terminal connected to a comparator, and a second terminal configured to receive a power supply voltage. A plurality of voltage biasing elements are each connected to a respective one of the second terminal and configured to apply a bias voltage to the second terminal so as to bias the power supply voltage.

In another embodiment, a multilevel memory sensing system for detecting a voltage level stored in a multilevel memory cell comprises a plurality of memory sensing circuits each having a first terminal connected to a multilevel memory cell, an output terminal connected to a comparator, a second terminal configured to receive a power supply voltage, and a bias transistor connected between the second terminal and the output terminal, wherein each bias transistor has a gate terminal. A power line is connected to each of the second terminals and configured to apply the power supply voltage to the second terminals. Also, a bias voltage line is connected to each of the gate terminals and configured to apply a bias voltage to the gate terminals of the bias transistors.

In another embodiment, a sense amplifier for use with nonvolatile memory comprises a first input and a second input for receiving signals from a nonvolatile memory, and an output circuit. A first transistor input pair is coupled to the first input, the second input, and the output circuit, the first transistor input pair configured to amplify a difference between a voltage applied to the first input and a voltage applied to the second input according to a first common input range. Also, a second transistor input pair is coupled to the first input, the second input, and the output circuit, the second transistor input pair configured to amplify a difference between a voltage applied to the first input and a voltage applied to the second input according to a second common input range.

In another embodiment, a nonvolatile memory array system comprises a plurality of bitlines each in electrical communication with cells of a nonvolatile memory array, and a sense amplifier in communication with the plurality of bitlines. The sense amplifier has a plurality of transistors each having an input terminal configured to receive a sense amplifier signal, an output terminal configured to transmit an output signal, and a gate terminal. Each of the gate terminals is electrically connected to a bitline of the plurality of bitlines, so as to control a transmission of the output signals according to signals transmitted along the respective bitline.

In another embodiment, a nonvolatile memory array system comprises a plurality of bitlines each in electrical communication with cells of a nonvolatile memory array, as well as a plurality of switch transistors each having a terminal in electrical communication with a respective one of the bitlines and configured to activate the respective one of the bitlines. Also included are a plurality of leakage current reduction circuits each in electrical communication with a respective one of the switch transistors and a respective one of the bitlines, each of the leakage current reduction circuits configured to reduce a leakage current transmitted from the respective one of the switch transistors to the respective one of the bitlines.

In another embodiment, a nonvolatile memory array system comprises a plurality of bitlines each in electrical communication with cells of a nonvolatile memory array, at least one voltage source, and a plurality of PMOS transistors electrically connected to a respective one of the bitlines. Each of the PMOS transistors has a source terminal electrically connected to the respective one of the bitlines, and a base terminal electrically connected to at least one of the at least one voltage source, so as to reduce a leakage current to the respective one of the bitlines according to a body effect when a voltage is applied to the base terminal.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EMBODIMENTS OF THE INVENTION

In one aspect, the invention concerns a memory system that compensates for power level variations in sense amplifiers for multilevel memory. For example, a compensation circuit can be employed to compensate for current or voltage variations in the power supplied to multilevel memory sense amplifiers. As another example, compensation can be accomplished by application of a bias voltage to the power supply. Another example is a sense amplifier configured with improved input common mode voltage range. Such sense amplifiers can be two-pair and three-pair sense amplifiers.

Further examples of the invention include more simplified sense amplifier configurations, and sense amplifiers having reduced leakage current.

Figure 1:
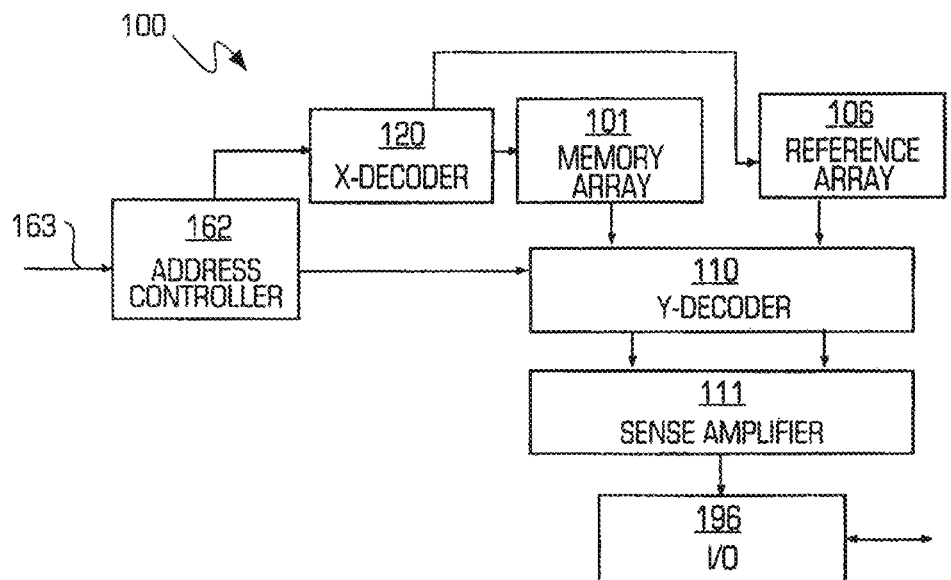
FIG. 1 is a block diagram illustrating a digital multilevel bit memory system.

FIG. 1 is a block diagram illustrating a digital multilevel bit memory array system 100. The digital multilevel bit memory array system 100 includes a memory array 101 that includes a plurality of memory cells (not shown) and a reference array 106 that includes a plurality of reference memory cells (not shown). An N bit digital multilevel cell is defined as a memory cell capable of storing the $2^N$ levels. The reference array 106 is used as a reference system of reference voltage levels to verify the contents of the memory array 101. In another embodiment, the memory array 101 may include reference memory cells for storing the reference voltage levels.

In one embodiment, the memory array 101 and the reference array 106 include a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x decoder 120, a y decoder 110, an address controller 162, a sense amplifier circuit 111, and an intelligent input/output interface 196. The y decoder 110 controls bitlines (not shown) coupled to columns in memory cells and the reference voltage cells, during a write, read (or verify), and erase operations. The sense amplifier 111 senses the read data which is provided to the I/O interface 196. The I/O interface 196 also buffers input into the memory array system 100. The sense amplifier 111 also senses the read data and verifies the read data against input data during memory programming or erasing.

In response to an address signal 163 and other control signals (not shown), the address controller 162 decodes the address signal 163 and controls page, byte, segment or other addressing for the x decoder 120 and the y decoder 110. The x decoder 120 selects a row or a block of rows in the arrays 101 and 106 based on the signals from the address controller 162 and provides precise multilevel bias values over temperature, process, and power supply used for consistent single level or multilevel memory operation for the memory array 101.

The system 100 includes power related circuits (not shown), such as band gap voltage generators, charge pumps, voltage regulators, and power management systems, and other control circuits (not shown) such as voltage algorithm controllers.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Figure 2:
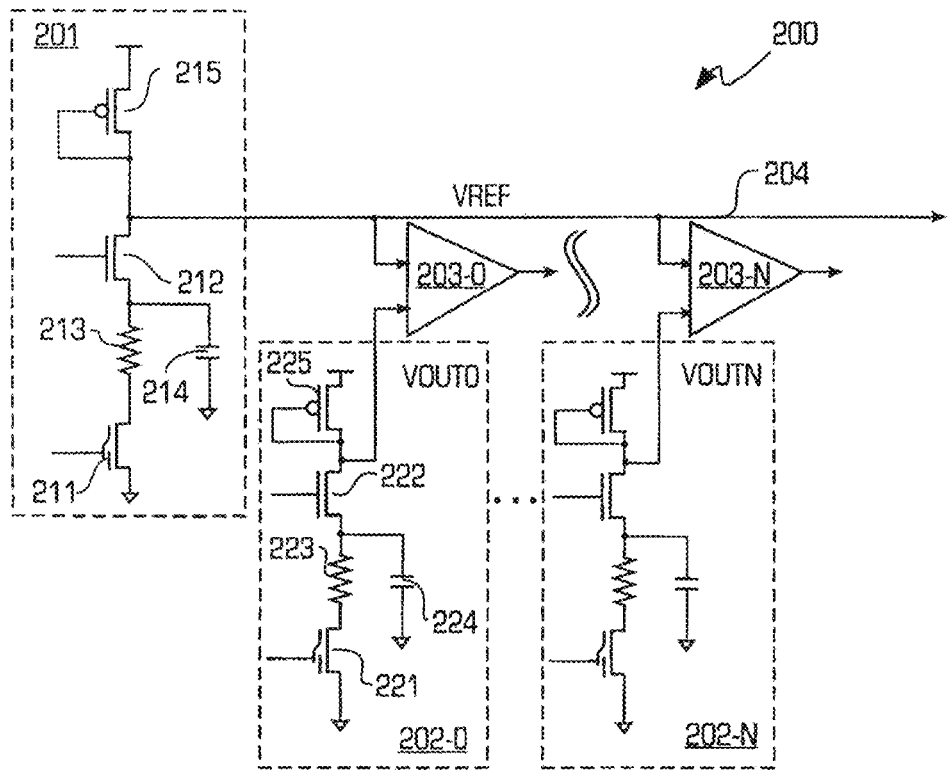
FIG. 2 is a schematic diagram illustrating a conventional sensing system.

FIG. 2 is a schematic diagram illustrating a conventional sensing system 200. The conventional sensing system 200 comprises a reference column 201, a plurality of data columns 202-0 through 202-N, and a plurality of comparators 203-0 through 203-N. The reference column 201 comprises a reference memory cell 211, an NMOS transistor 212 and a PMOS transistor 215. A bitline resistor 213 is shown to indicate resistance on the bitline. A bitline capacitor 214 is shown to indicate capacitance on the bitline. The reference column 201 provides a voltage reference on the reference line 204 which is applied to a first input of each of the comparators 203-0 through 203-N. Each data column 202 comprises a data memory cell 221, an NMOS transistor 222 and a PMOS transistor 225. A bitline resistor 223 is shown to indicate resistance on the bitline. A bitline capacitor 224 is shown to indicate capacitance on the bitline. Each of the data columns 202-0 through 202-N provides a data output voltage to a second input of a respective comparator 203-0 through 203-N so that the comparator 203 provides an output indicative of the stored data in the corresponding data column 202.

The conventional sensing system 200 has mismatches within the system because of differences in the PMOS transistors 215 and 225 that provide loads for the respective reference column 201 and the data column 202. Further, the comparators 203 have a mismatch in their inputs. These mismatches may lead to inaccurate reads of the data cells 221. Moreover, the bitlines may have a mismatch in capacitances that may lead to inaccurate reads, especially in dynamic reads. Other mismatches may come from layout, such as voltage drop along power lines or interconnect lines.

The mismatches may cause a difference dVo in voltage between outputs of the comparators 203 due to the PMOS transistors mismatch of the threshold voltage VT, beta mismatch, or voltage drop mismatch, such as VDD, bias current Ibias, or voltage bias Vbias. The difference voltage dVo is typically between 20 and 50 millivolts, but can be higher, e.g., a few hundred millivolts for current large chips.

Figure 3:
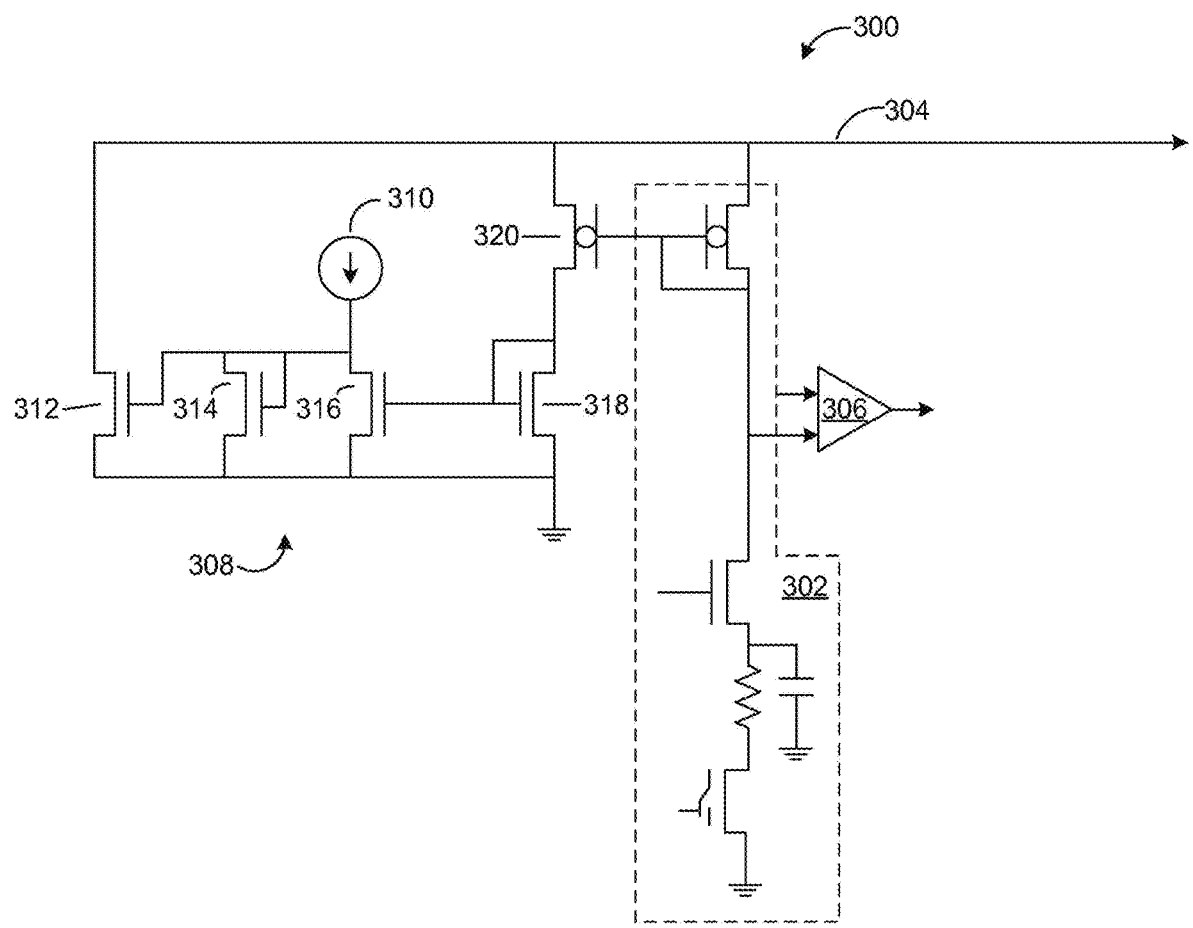
FIG. 3 is a schematic diagram illustrating a multilevel bit memory system employing a compensation circuit configured to compensate for cell current variation.

The sense amplifier 111 (FIG. 1) may include the sensing systems and subsystems of FIGS. 3-16. FIG. 3 is a schematic diagram illustrating a multilevel bit memory system employing a compensation circuit configured to compensate for cell current variation. Here, a sensing system 300 includes a data column 302 with a supply voltage VDD line 304. The data column 302 transmits data signals to a comparator 306. Also included is a compensation circuit 308 that includes a current source 310 and transistors 312-320. It is known that voltage drops along the VDD line 304 due to the resistance of the line itself and the current it carries, leading to potential errors in the reading and writing of data if the voltage drop is sufficiently large. The compensation circuit 308 compensates for this voltage drop by rendering the voltage drop somewhat constant, rather than varying based on cell current or other factors. More specifically, the current source 310 is configured to supply a current greater than or approximately equal to that typically supplied by the data column 302, so as to provide a compensating current to the VDD line 304.

In operation, it can be seen that the current through transistor 318 is mirrored to transistor 316. The remaining current (the current of the current source 310, minus the current mirrored into transistor 316) flows into the transistor 314, is mirrored into transistor 312, and is then supplied to power line 304. The compensation circuit 308 thus helps maintain a constant current on power line 304. As a numerical example, assume that the current source 310 is a 30 µA current source, and that the current through the data column 302 is 20 µA. As above, this 20 µA is mirrored by transistors 318, 320 into transistor 316, which thus sinks 20 µA of current from the current source 310. The remaining current from current source 310, i.e., 30 µA-20 µA=10 µA, flows to transistor 314 and is mirrored into transistor 312. If a mirror ratio of 2× from transistor 314 is employed so that 2×10 µA=20 µA is supplied to power line 304, it can be seen that the total current flowing into power line 304 is 20 µA (through transistor 312)+20 µA (through transistor 320)+20 µA (from data column 302)=60 µA.

Now assume that current from data column 302 is 0 µA. Transistor 316 is thus off, meaning all current from current source 310 flows into transistor 314 and is mirrored (with a 2× ratio) into transistor 312, so as to supply 2×30 µA=60 µA, i.e., the same current as before. Hence, the compensation circuit 308 helps ensure that a roughly constant current is always supplied to power line 304. The compensation circuit 308 thus supplies a variable current that helps keep overall current constant through the power line 304, maintaining the voltage (IR) drop due to the resistance of the VDD line 304 constant. This approach can also help compensate for the temperature coefficient (TC) of the IR drop, as it can be seen that the compensation current can be tuned to correct for variations due to temperature effects. That is, the compensation current can be configured with an opposing TC, such as by a band gap with a positive or negative TC.

Figure 4A:
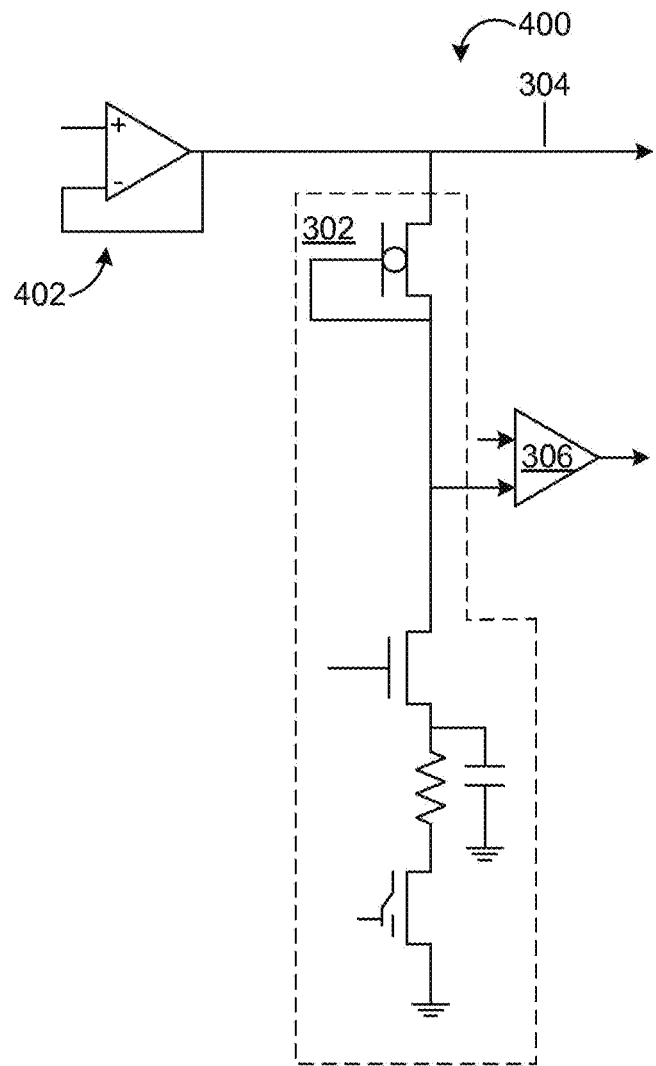
FIGS. 4A-4C are schematic diagrams illustrating a multilevel bit memory system employing an operational amplifier to compensate for cell voltage variation.

It should be noted that the invention encompasses other compensation circuits besides the circuit 308 of FIG. 3. For instance, FIG. 4A is a schematic diagram illustrating a multilevel bit memory system employing an operational amplifier to compensate for cell voltage variation due to power line voltage variations. Here, sensing system 400 includes a data column 302 and VDD line 304 as in FIG. 3. However, the compensation circuit 308 is replaced with an operational amplifier 402. The operational amplifier 402 forces a constant voltage at its output, i.e., along the VDD line 304. The net effect is thus the avoidance of voltage drops along VDD line 304.

Figure 4B:
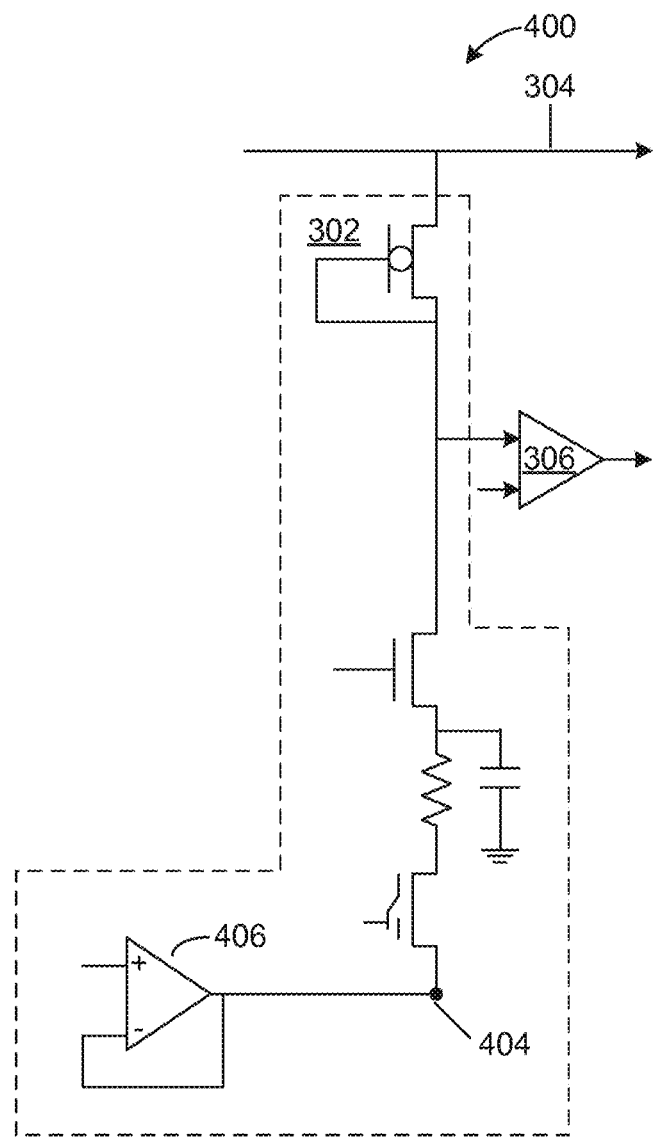

The invention also includes other uses of operational amplifiers in compensating for detrimental voltage drops. For example, FIG. 4B illustrates the use of an operational amplifier to compensate for variation in voltage at the ground node of a data column. Node 404 of the sensing system 400 can be a ground node, as in FIG. 4A. However, unlike FIG. 4A, the node 404 is connected to an operational amplifier 406 that is configured as a feedback circuit as shown. Here, the operational amplifier 406 can be configured to maintain its output, node 406, at ground or zero voltage, or close thereto, creating a forced "virtual ground" node. The use of an element such as operational amplifier 406 to force a constant zero or close to zero voltage yields a more constant ground terminal having reduced voltage drift, allowing for more accurate read/write operations to the data column 302.

Figure 4C:
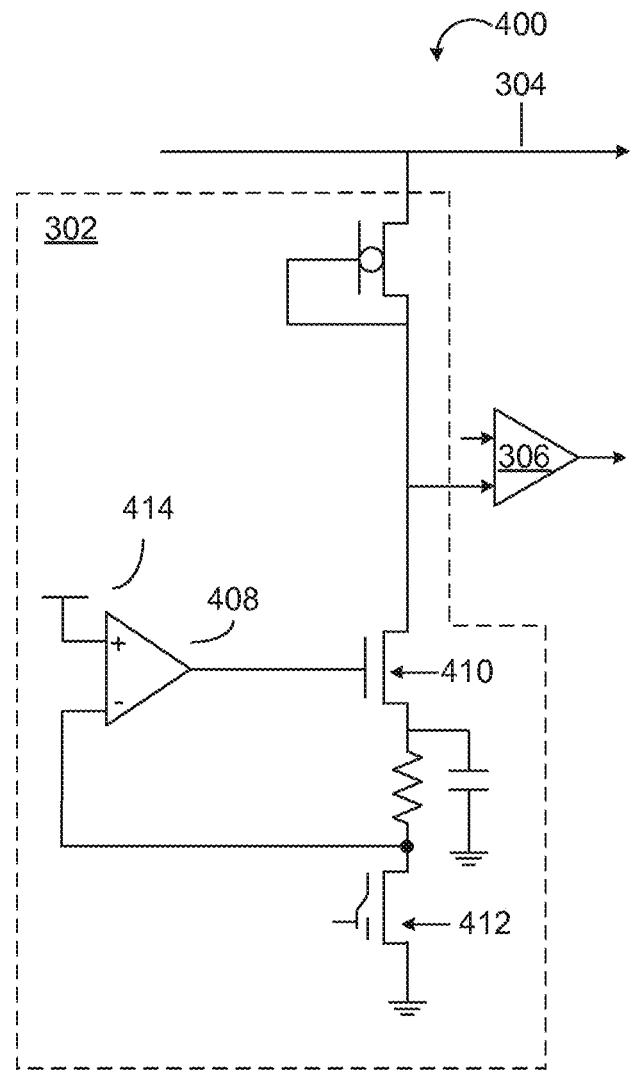

Operational amplifiers can also be employed to apply bias voltages within data columns. For example, FIG. 4C illustrates the use of an operational amplifier to apply a bias voltage on the bitline end (bitline bottom in FIG. 4C) of data column 302. More specifically, the output of operational amplifier 408 is connected to the gate of transistor 410 (i.e., the bitline cascoding transistor, that connects to the bitline top), and the inverting input of the operational amplifier 408 is connected between the transistor 410 and the multilevel memory cell 412. The noninverting input of the operational amplifier 408 is connected to a reference bias voltage 414. In this manner, the operational amplifier 408 maintains a constant bias voltage at the drain terminal of any selected memory cell 412, without voltage drop along the bitline from transistor 410 to the drain terminal of selected memory cell 412.

It should be noted that the invention is not limited any single one of the embodiments shown in FIGS. 3 and 4A-4C. Rather, it can include any combination of the elements therein. For example, a compensation circuit 308 or operational amplifier 402 can be employed to compensate for voltage variations along a VDD line of a data column 302, while an operational amplifier 406 can be simultaneously employed to compensate for voltage variations at the ground node 404 of the same data column 302.

Figure 5:
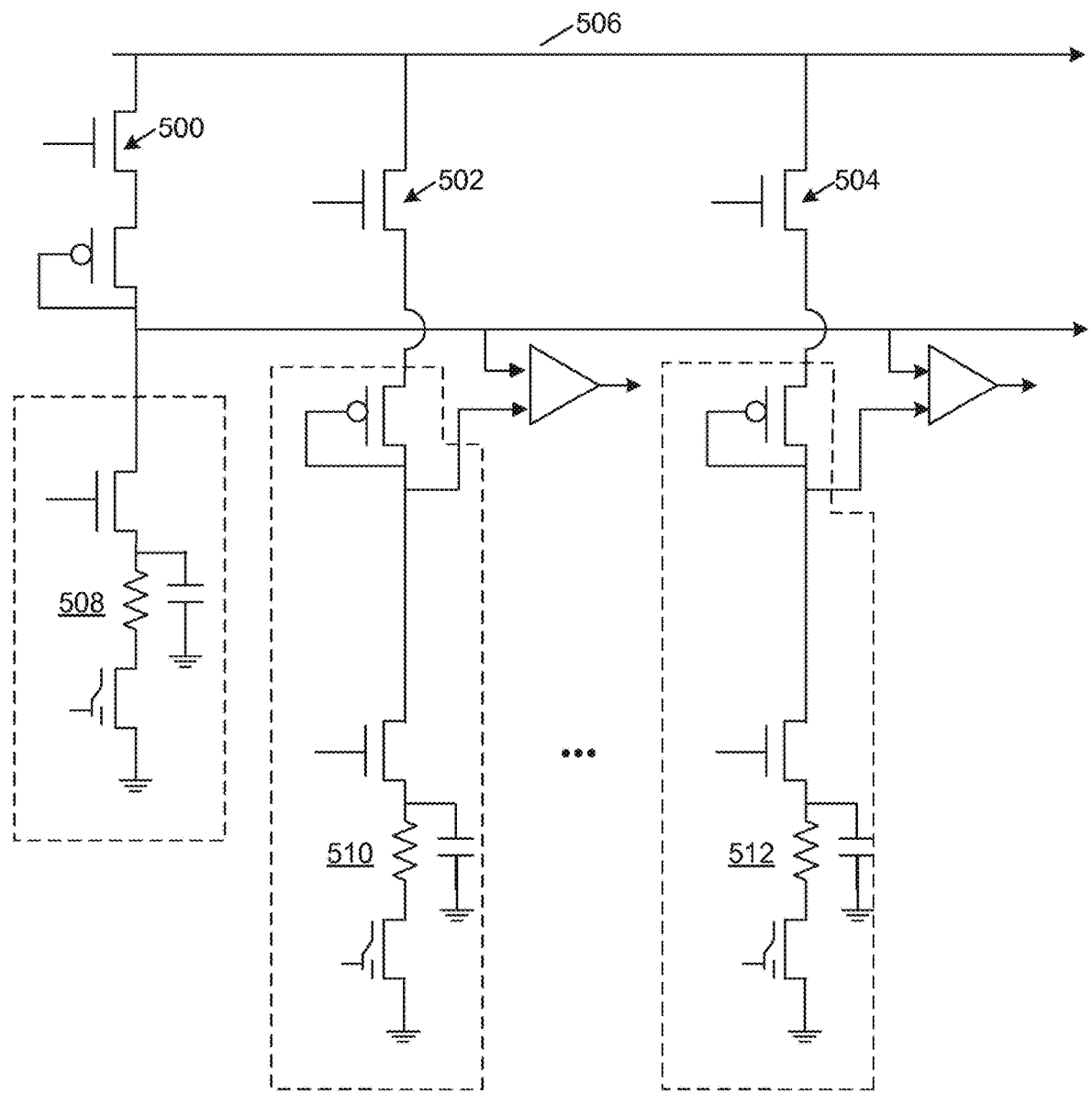
FIGS. 5-10 are schematic diagrams illustrating multilevel bit memory system having voltage-biased power supplies according to various embodiments of the invention.

In similar manner to FIG. 4C, other embodiments of the invention also include the ability to apply bias voltages to the VDD lines of multilevel memory cells. FIG. 5 illustrates one such embodiment. Here, one of the NMOS transistors 500-504 is added between VDD line 506 and each respective data column 508-512. The gate of each transistor 500-504 is connected to a common VCBIAS power supply line (not shown) in known fashion, allowing the VCBIAS line to bias the voltage signal supplied to each data column 506-510 and compensate for losses in the VDD line 506. The NMOS transistors 500-504 act to isolate the voltage variation (on their drain terminals) in power line 506 from the voltage supplied to their respective data columns 509-512 (via their source terminals) through their source follower behavior, i.e., the voltage on the source terminals of NMOS transistors 500-504 primarily follows their gate voltage (VCBIAS) but not their drain voltage.

Figure 6:
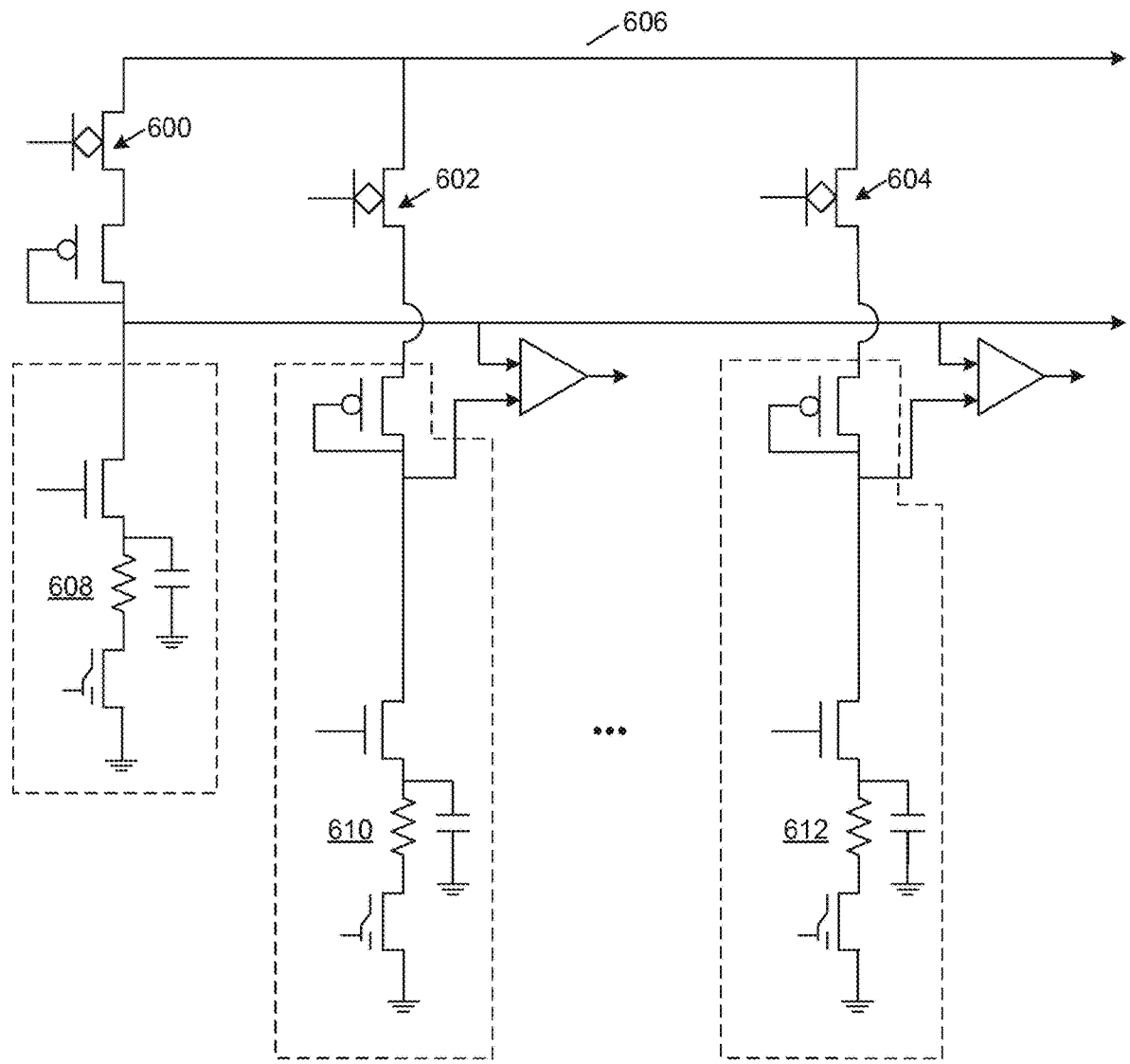

Another such embodiment is shown in FIG. 6. Here, transistors 600-604 are added between VDD line 606 and data columns 608-612, as above. In this embodiment, the transistors 600-604 are native NMOS transistors, which are desirable in certain applications due to their ability to support a bias voltage from the VCBIAS line (not shown) without significant voltage drop across the transistors 600-604 themselves.

Figure 7:
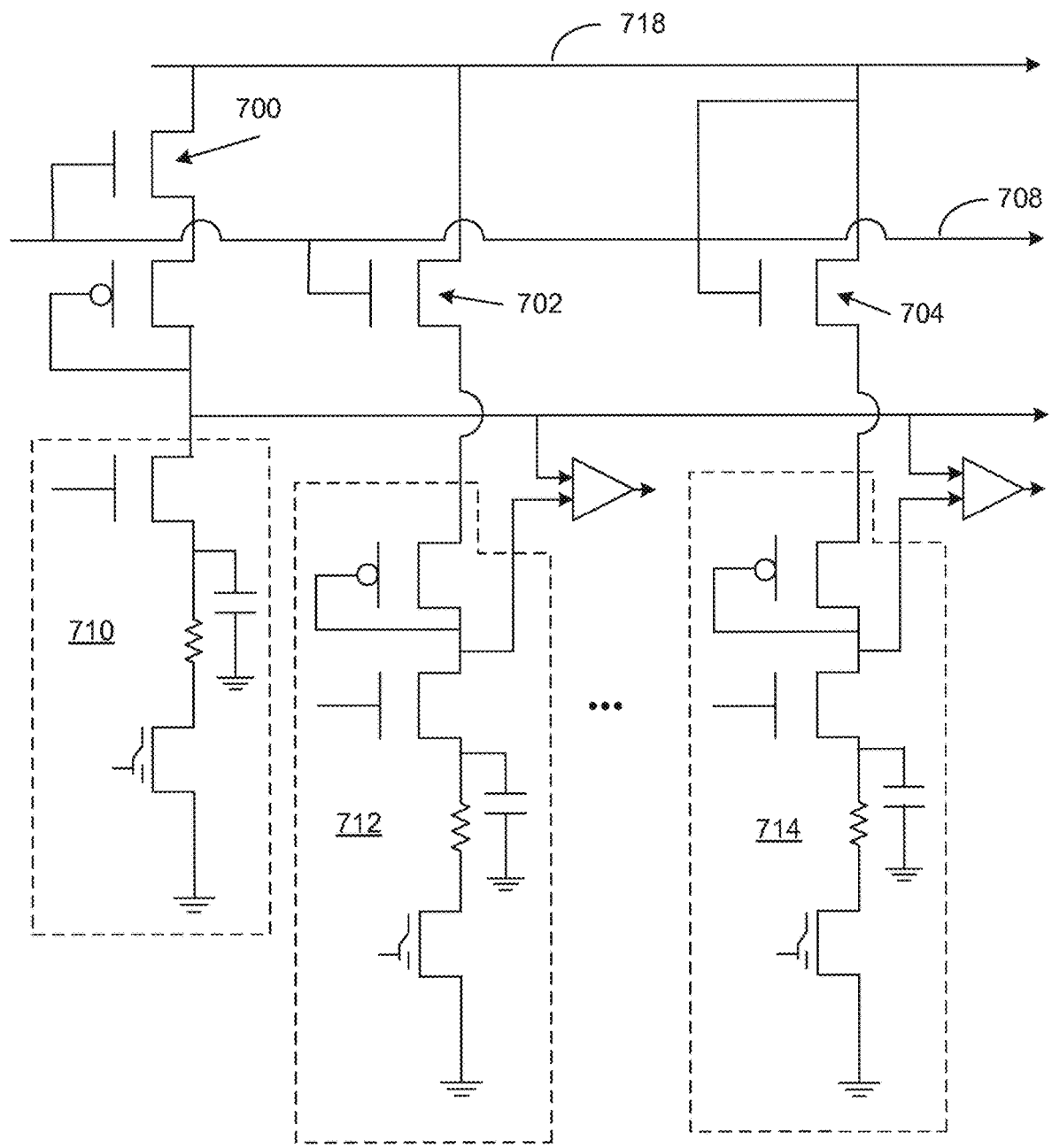

Another embodiment is shown in FIG. 7. Here, transistors 700-704 are added to respective data columns 710-714 as above. However, a passive line 708 is employed instead of a VCBIAS line. The gate terminals of transistors 700-704 are then connected to line 708 and the gate terminal of at least one transistor 704 is also connected to VDD line 718. Connected in this manner, VDD line 718 effectively biases each transistor 700-704 when it is active. The transistors 700-704 can be native NMOS transistors as above, so as to avoid significant voltage drop across them, but the invention includes the use of any suitable transistors.

Figure 8:
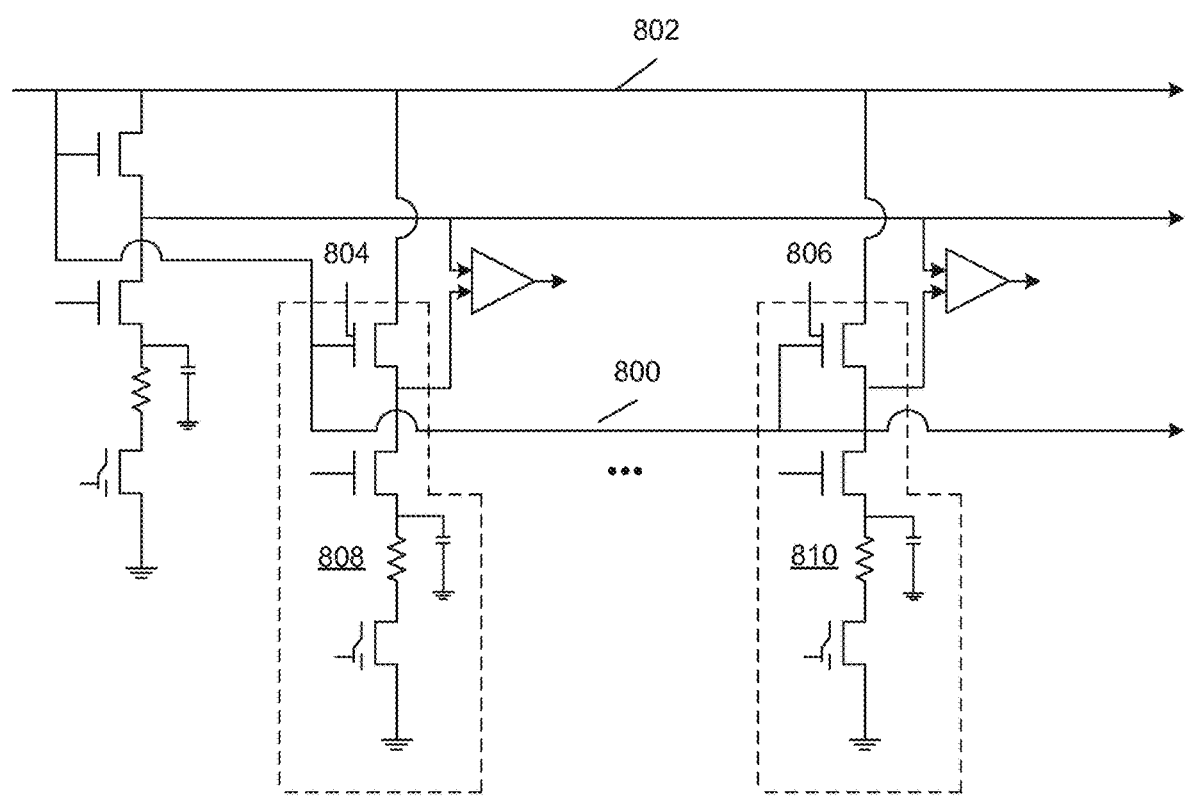
Figure 9:
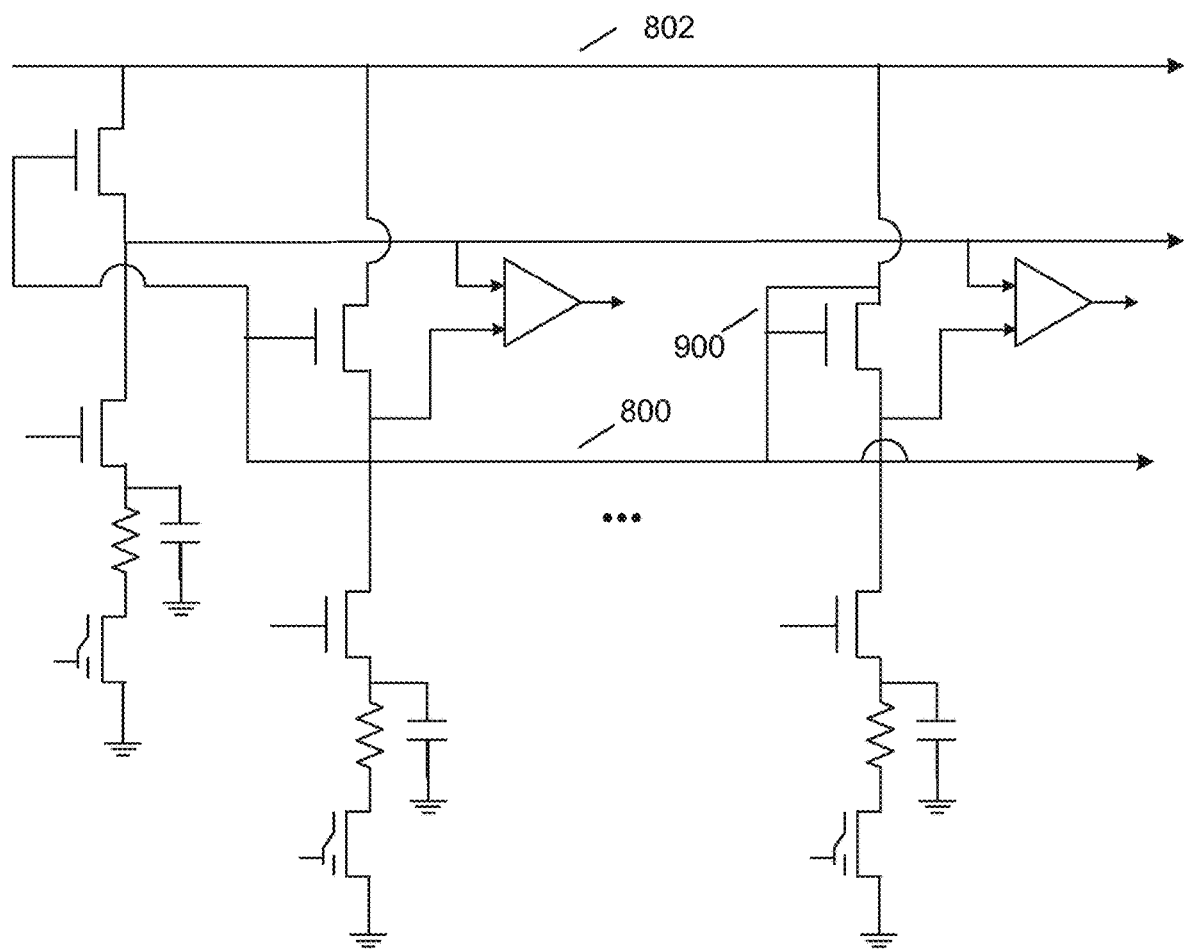

Similarly, the VDD line can also be employed to bias the bitline end of data columns. FIG. 8 illustrates such an embodiment. Here, transistors 804-806 can be added to the bitline-end of data columns 808-810 as shown, and line 800 is extended from VDD line 802, and connected to their gate terminals. This allows the VDD line 802 to both supply power to the data columns 808-810, and supply a bias voltage to the bitline-ends of data columns 808-810. As with other embodiments of the invention, the added transistors 804-806 can be native NMOS transistors, although the invention contemplates the use of any transistor suitable for use within a multilevel memory data column. It should be noted that the invention contemplates other connections between VDD line 802 and line 800 besides that shown in FIG. 8. FIG. 9 illustrates one such example, in which line 800 is connected to VDD line 802 by line 900, at the bitline-end of a data column. It can be seen that any connection between the line 800 and VDD line 802 suffices to supply an appropriate biasing signal. Accordingly, the invention encompasses any connection between the VDD line 802 and bias transistors of a data column that is suitable for biasing the data column. In FIGS. 8-9, NMOS transistors are used instead of PMOS transistors, to pull up load for sensing of the data columns. The sources of the NMOS transistors are sensed output nodes amplifying the memory cell current.

Figure 10:
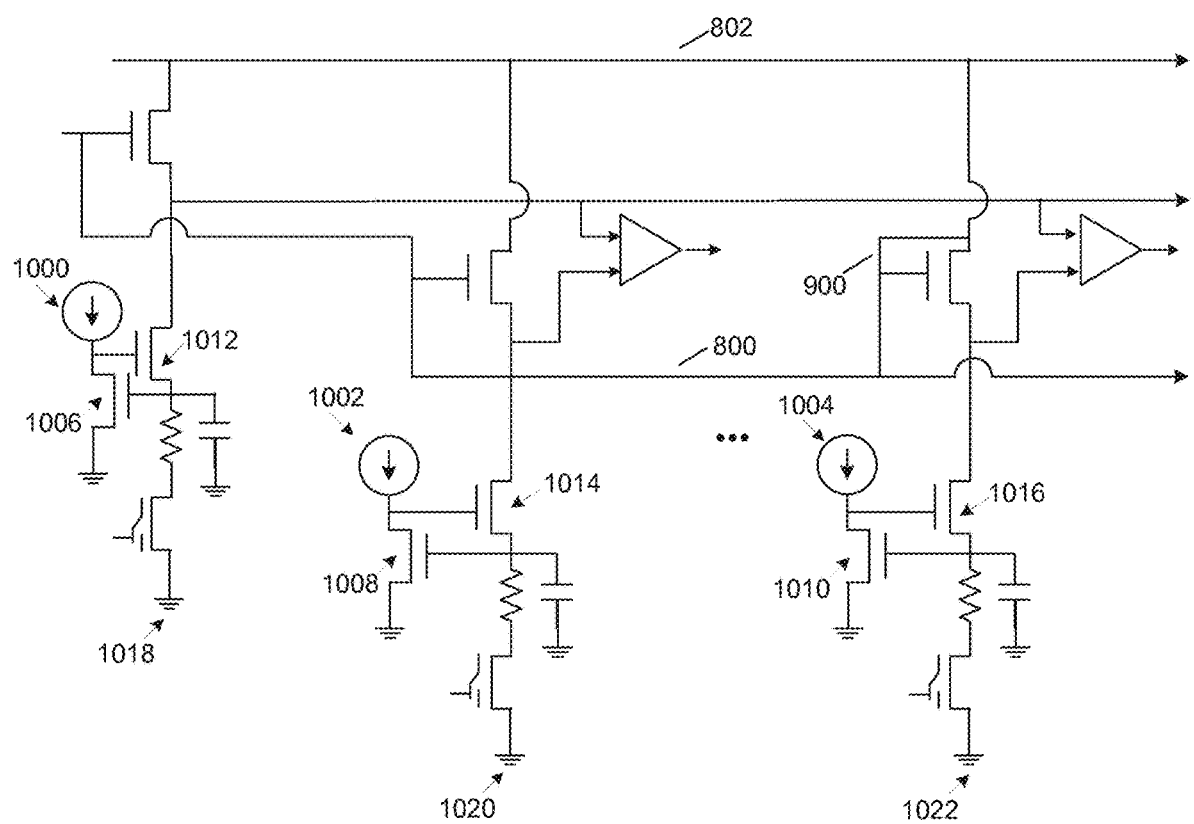

It can be seen that the biasing methods of FIGS. 8-9 can also be employed in combination with other forms of biasing. For example, FIG. 10 illustrates line 900 interconnecting VDD line 802 and line 800 as in FIG. 9. However, each data column also includes an additional current source 1000-1004 that is connected to an additional transistor 1006-1010. When the current sources 1000-1004 (which can all be connected to a common source) are active, they supply current to the transistors 1006-1010 and to the gate terminals of transistors 1012-1016 of the data columns 1018-1022, biasing the data columns 1018-1022 according to the voltage drop across transistors 1006-1010. In this manner, voltage biasing may be accomplished by line 800 and VDD line 802, as well as by separate current sources 1000-1004. The invention contemplates the use of either approach, or both in combination. Likewise, the invention also contemplates the use of either of these approaches along with other methods of applying a bias voltage. For instance, the line 800 can be a separate active VDDBIAS line (without, of course, line 900) instead of being passively connected to VDD line 802.

Figure 11:
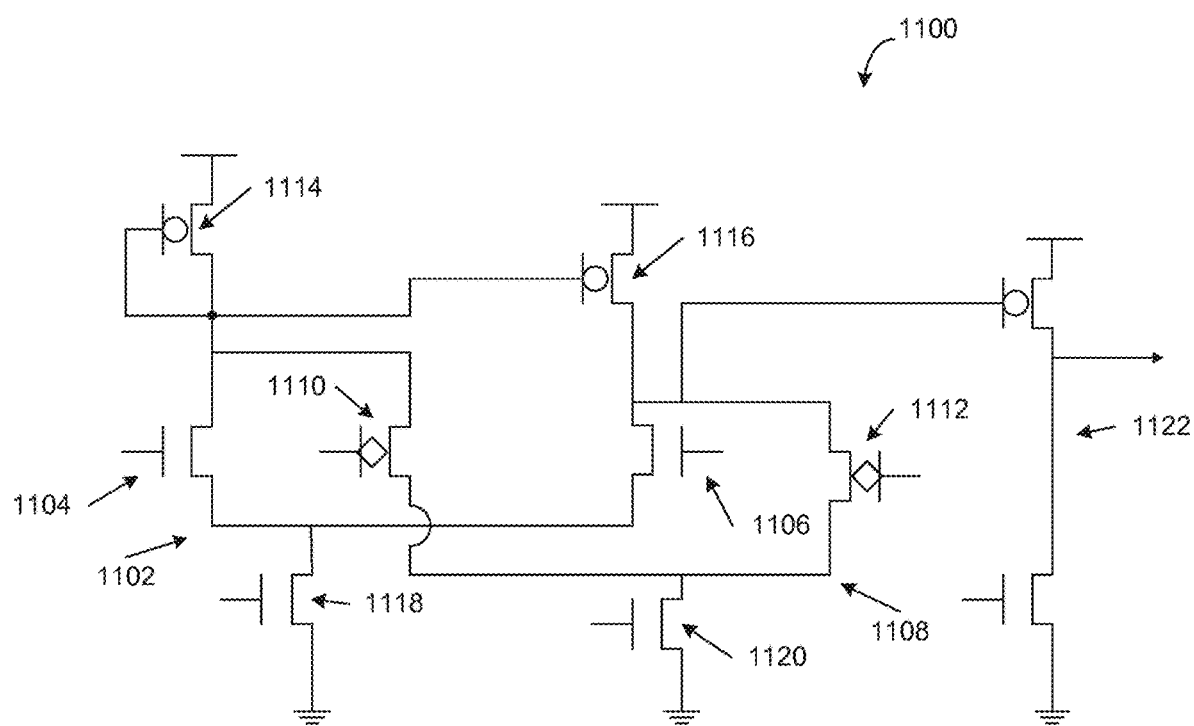
FIG. 11 is a schematic diagram illustrating a two-pair sense amplifier for a multilevel bit memory system, the sense amplifier having improved input common mode voltage range.

In addition to the compensation and biasing approaches discussed above, the invention also contemplates other ways to improve the accuracy of multilevel memory devices. As one example, FIG. 11 illustrates a two-pair sense amplifier for a multilevel bit memory system, the sense amplifier having improved input common mode voltage range making it less sensitive to power supply variations. It is known that conventional positive feedback differential sense amplifiers are limited in their input common mode ranges. That is, the range of voltages that can be sensed is limited by the threshold voltages of the transistors employed in the sense amplifier. To that end, sense amplifier 1100 includes a first input pair 1102 that is a conventional differential sense amplifier input pair, with transistors 1104, 1106 receiving sensed voltage signals at their gate terminals, and amplifying the difference in these voltage signals to determine the corresponding stored data. In addition to this conventional first input pair 1102, the sense amplifier 1100 also includes a second input pair 1108 with transistors 1110, 1112 having their own bias transistor 1120. Other components operate in known fashion. For instance, transistors 1114, 1116 can operate as a current mirror, transistors 1118, 1120 can bias the input pairs 1102, 1108, and output stage 1122 can transmit the amplified difference signal to other devices.

The transistors 1110, 1112 have different threshold voltages than transistors 1104, 1106, thus improving the overall input common mode voltage range of the sense amplifier 1100. For example, if transistors 1104, 1106 have threshold voltages of approximately 1.0 V, a sense amplifier employing these transistors 1104, 1106, without the second input pair, would be limited to sensed voltage signals greater than 1.0 V. However, if the second input pair of transistors 1110, 1112 are native NMOS transistors, their threshold voltages are approximately 0.0 V, allowing the sense amplifier 1100 the ability to sense voltage signals down to 0.0 V. The use of this second input pair thus extends the common mode voltage range of the sense amplifier 1100 over the range of only a single input pair. The second input pair 1110, 1112 has its own bias transistor 1120 to avoid bias coupling from the first input pair 1104, 1106.

Figure 12:
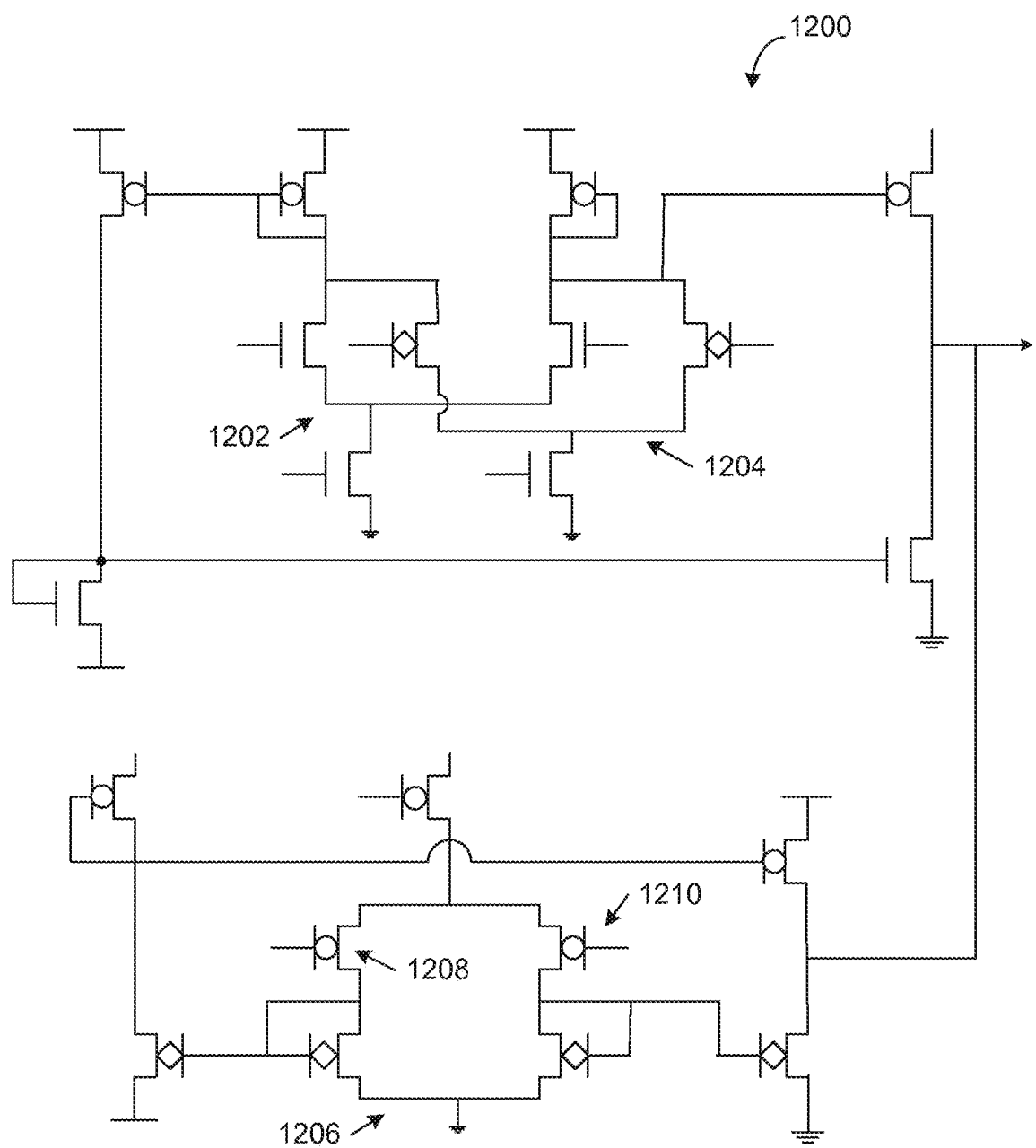
FIG. 12 is a schematic diagram illustrating a three-pair sense amplifier for a multilevel bit memory system, the sense amplifier having improved input common mode voltage range.

One of ordinary skill in the art will recognize that the invention is not limited to the threshold voltage values listed above. Rather, the invention encompasses the use of any transistors in the first input pair 1102 and second input pair 1108 having any appropriate threshold voltages for increasing the overall common mode voltage range of the sense amplifier 1100. Also, the invention is not limited to simply two input pairs, but can employ additional input pairs to further improve overall common mode voltage range. As one example, FIG. 12 is a schematic diagram illustrating a three-pair sense amplifier for a multilevel bit memory system. The sense amplifier 1200 has a first input pair 1202 and a second input pair 1204 configured similar to the sense amplifier 1100 of FIG. 11. However, the sense amplifier 1200 also includes a third input pair 1206 with transistors 1208, 1210 that receive the sensed voltage signals at their gate terminals. If the transistors 1208, 1210 have threshold voltages that are not between those of the first input pair 1202 and the second input pair 1204, one of ordinary skill in the art will observe that the third input pair 1206 will further extend the input common mode voltage range of the sense amplifier 1200.

Figure 13:
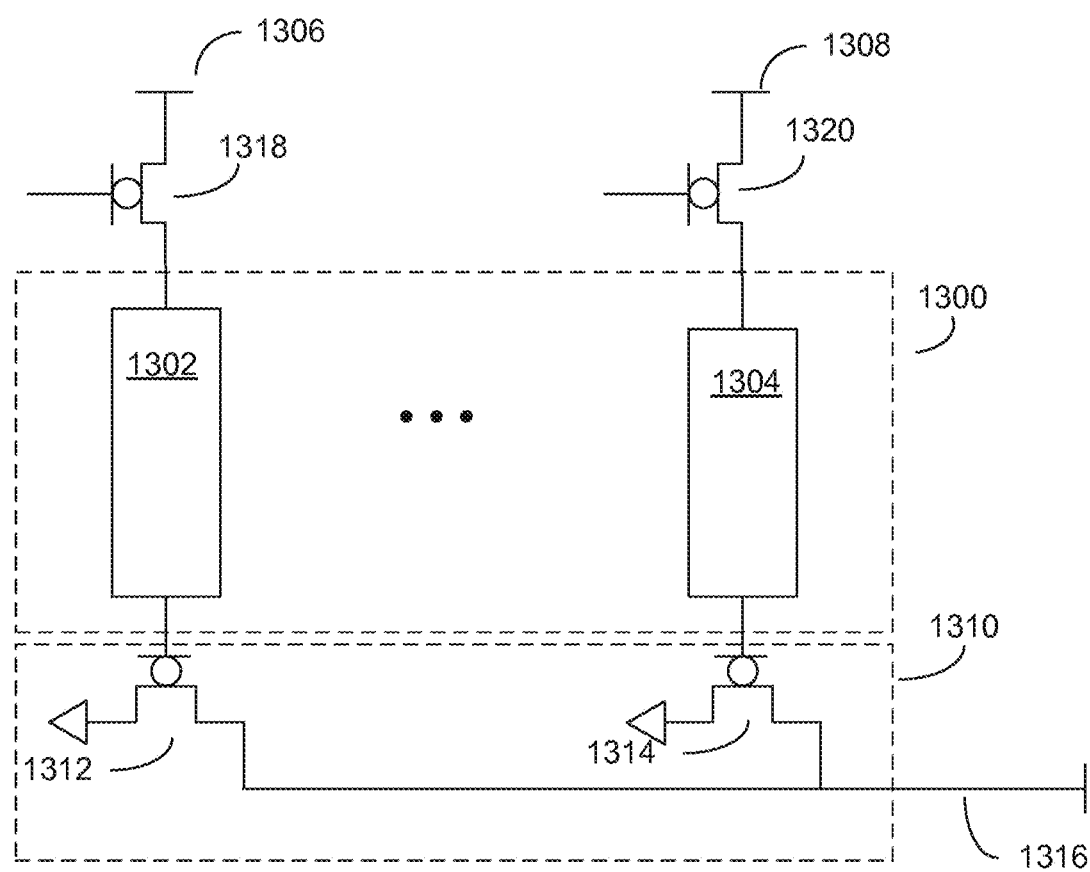
FIG. 13-14 is a schematic diagram illustrating a multilevel memory array having simplified sense amplifiers.

In addition to the various compensation approaches described above, the invention also encompasses apparatuses and methods that yield simplified sense amplifiers, and simplified voltage sensing. FIG. 13 illustrates one example (where other details, such as devices for precharging and discharging with a sense cycle, not shown). Here, a memory array 1300 contains data columns 1302, 1304 as before. The data columns 1302, 1304 are connected to a VDD source 1306, 1308 as discussed previously, and are connected at their other ends to a sense amplifier 1310. However, instead of being configured as a comparator, the sense amplifier 1310 is instead configured with a number of transistors 1312, 1314. The outputs of the data columns 1302, 1304 are connected to the gates of the transistors 1312, 1314. In this manner, the VDD source 1306, 1308 can supply a voltage to the data columns 1302, 1304. Those data columns 1302, 1304 storing a binary 1 (or any data represented by a threshold voltage greater than the voltage supplied by the VDD source 1306, 1308) will sink any current from the source 1306, 1308 and will pass a low voltage, e.g. zero, to the gate terminals of their associated transistor 1312, 1314 to turn them on. Those transistors 1312, 1314 will then transmit a signal supplied by bias line 1316, indicating that their data columns 1302, 1304 store a binary 1.

Conversely, those data columns 1302, 1304 storing a binary 0, or any other data represented by a threshold voltage less than the voltage supplied by source 1306, 1308, will not sink any current from the source 1306, 1308, and will not apply a low voltage to their associated transistors 1312, 1314. These transistors 1312, 1314 will not be turned on and will not transmit any signal from bias line 1316, indicating that their particular data columns 1302, 1304 store a binary 0.

Figure 14:
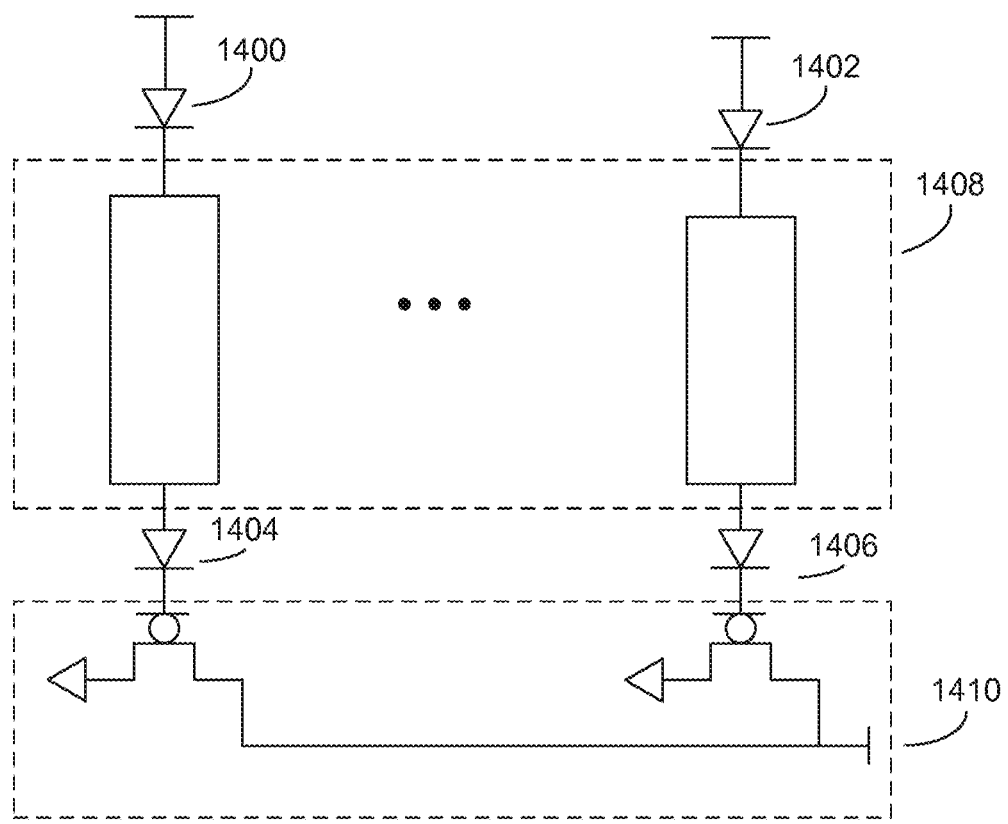

It should be noted that the transistors 1312, 1314 of the sense amplifier 1310 can be NMOS transistors, or any other suitable transistor. It should also be noted that, while transistors such as PMOS transistors 1318, 1320 can be used as pass transistors, the invention also contemplates the use of any other suitable device for passing power from the VDD sources 1306, 1308. As one example, FIG. 14 illustrates the use of diodes 1400-1406 (with diodes 1404, 1406 being optional) in place of the PMOS transistors 1318, 1320, to pass signals to the memory array 1408 and sense amplifier 1410.

Figure 15:
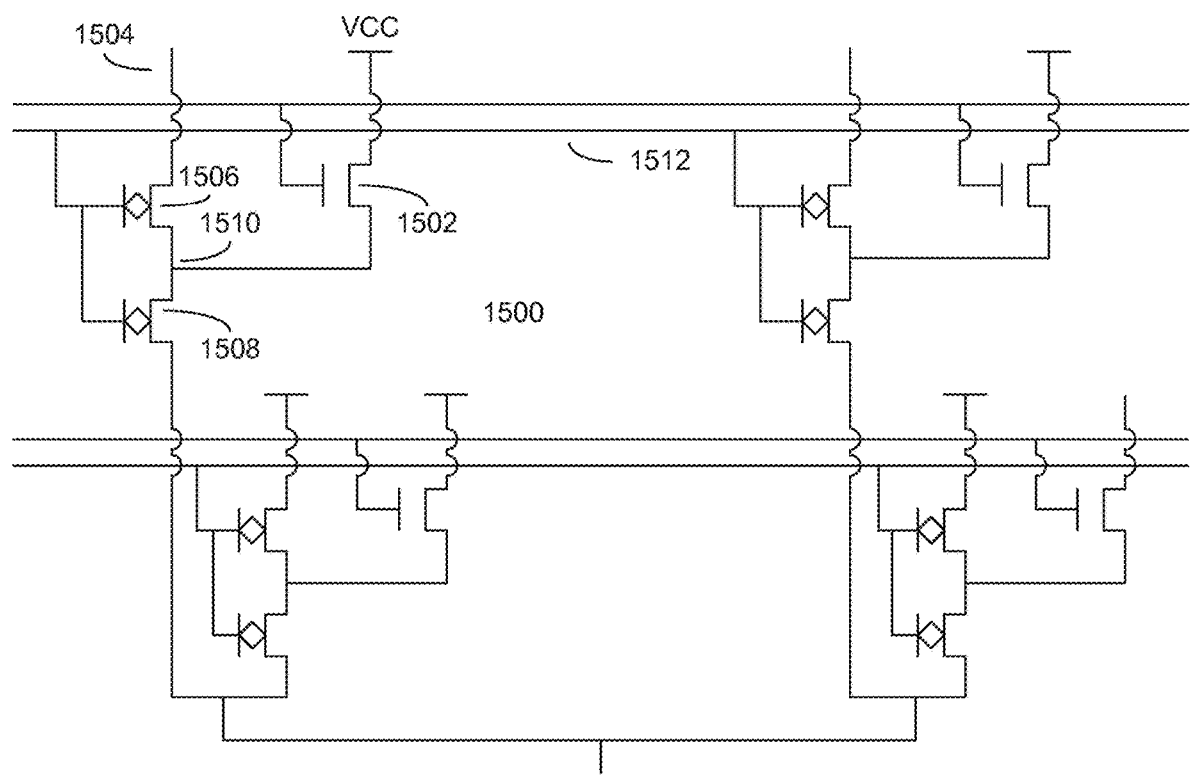
FIGS. 15-16 are schematic diagrams illustrating decoding circuits having reduced leakage currents, according to various embodiments of the invention.

The invention also encompasses apparatuses and methods for reducing leakage current to levels that do not interfere with the memory cell current in sensing, thus resulting in more accurate sensing. More specifically, leakage current along unselected bitlines of a memory system can be reduced by appropriate configuration of the associated decoder circuits. FIG. 15 illustrates one example of a decoding circuit configured to yield a reduced leakage current. Here, decoder circuit 1500 includes a VCC line governed by a transistor switch 1502 and two select transistors 1506, 1508 in series. In conventional decoder circuits, there is only one transistor, e.g. transistor 1506. Thus, when the transistor 1502 is turned off and the bitline is deselected, a small leakage current flows from the bitline through the unselected transistor 150 to the sensing circuitry (not shown), and can contribute to inaccurate data readings. To reduce this problem, bitline 1504 includes transistors 1502, 1506, 1508. In operation, transistors 1506, 1508 flank both sides of node 1510 (i.e., the VCC line's connection to bitline 1504), and are configured as depletion-mode devices, with a zero or negative voltage applied to the gate terminals of transistors 1506, 1508 by line 1512, so as to turn off transistors 1506, 1508 when they are unselected. With transistors 1506, 1508 unselected, and with the gate of transistor 1502 enabled to VDD, node 1510 is pulled to VDD-$V_T$ (the threshold voltage of transistor 1502) to reserve bias the transistors 1506, 1508 and stop the flow of leakage current from the bitline 1504 through transistors 1506, 1508 to the sensing circuitry (not shown). The leakage current now is steered from the bitline 1504 through transistor 1506 to transistor 1502. While the transistors 1506, 1508 are shown as NMOS transistors, the invention contemplates the use of any suitable device for reducing the flow of leakage current along bitlines.

Figure 16:
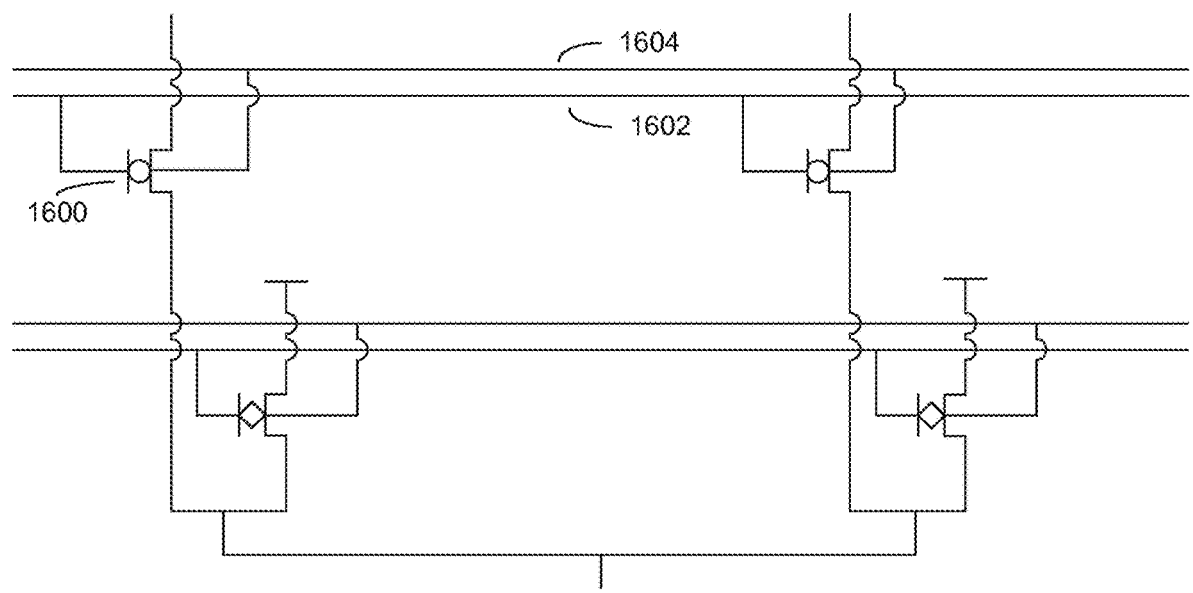

FIG. 16 illustrates another example of a more simplified decoding circuit configured to yield reduced leakage current. Here, instead of a pair of transistors 1506, 1508, a single PMOS transistor 1600 is employed, with its gate terminal connected to line 1602 and its base terminal connected to line 1604, as shown. The lines 1602, 1604 are decoded signal lines, e.g. when the line 1602 is selected to select transistor 1600, line 1604 is also selected to lower the body effect. Here, it can be seen that applying a bias voltage to the bulk of the transistor 1600 raises the threshold voltage of the transistor 1600 according to the body effect, thus resulting in less leakage current. The invention encompasses any suitable transistor, or configuration thereof, for reducing leakage current according to the body effect of transistors placed along a bitline. Also, it can be observed that the decoder circuits of FIGS. 15-16 can be employed in both an x decoder 120 and a y decoder 110.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For example, the invention encompasses circuits and systems employing any combination of the above-described compensation methods. Similarly, the compensation methods can be applied to various different portions of memory arrays and sense amplifiers, such as their VDD lines as well as their ground terminals. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A nonvolatile memory array system, comprising:
   a plurality of bitlines, each bitline coupled to a voltage source and a cell in a nonvolatile memory array; and
   a sense amplifier comprising a plurality of transistors, each of the plurality of transistors comprising:
   a gate coupled to one of the plurality of bitlines;
   a first terminal coupled to a power source; and
   a second terminal for generating an output signal for the coupled bitline;
   wherein if a selected cell stores a "1," the bitline coupled to the selected cell provides a zero voltage to the gate of the coupled transistor and the output signal of the coupled transistor indicates the "1" value.

2. The nonvolatile memory array system of claim 1, wherein the plurality of transistors is a plurality of PMOS transistors.

3. The nonvolatile memory array system of claim 1, further comprising a plurality of diodes each connected to an associated one of the bitlines and configured to pass a power signal along the associated one of the bitlines.

4. The nonvolatile memory array system of claim 1, wherein the cells are flash memory cells.

5. The nonvolatile memory array system of claim 2, wherein the cells are flash memory cells.

6. The nonvolatile memory array system of claim 3, wherein the cells are flash memory cells.

* * * * *